US008134368B2

(12) United States Patent
Timinger et al.

(10) Patent No.: US 8,134,368 B2
(45) Date of Patent: Mar. 13, 2012

(54) DETECTING QUENCH IN A MAGNETIC RESONANCE EXAMINATION SYSTEM

(75) Inventors: Holger Timinger, Hamburg (DE); Johannes Adrianus Overweg, Uelzen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 451 days.

(21) Appl. No.: 12/513,188

(22) PCT Filed: Nov. 5, 2007

(86) PCT No.: PCT/IB2007/054479
§ 371 (c)(1),
(2), (4) Date: May 1, 2009

(87) PCT Pub. No.: WO2008/056314
PCT Pub. Date: May 15, 2008

(65) Prior Publication Data
US 2010/0056378 A1    Mar. 4, 2010

(30) Foreign Application Priority Data

Nov. 10, 2006 (EP) ..................................... 06123803

(51) Int. Cl.
*G01V 3/00* (2006.01)
(52) U.S. Cl. ........................................ 324/318; 324/319
(58) Field of Classification Search .................. 324/318, 324/319, 322
See application file for complete search history.

(56) References Cited

U.S. PATENT DOCUMENTS

| 4,777,437 A | 10/1988 | Tashiro et al. |
| 6,147,844 A | 11/2000 | Huang et al. |
| 7,615,998 B2 * | 11/2009 | Huang et al. .................. 324/319 |
| 7,876,100 B2 * | 1/2011 | Huang et al. .................. 324/319 |
| 2008/0303523 A1 | 12/2008 | Overweg |

FOREIGN PATENT DOCUMENTS

| EP | 1612904 A2 | 1/2006 |
| JP | 59087804 A | 5/1984 |
| JP | 02202004 A | 8/1990 |

(Continued)

OTHER PUBLICATIONS

Carcagno, R. H., et al.; An FPGA-based Quench Detection and Protection System for Superconducting Accelerator Magnets; 2005; IEEE Proc. 2005 Particle Accelerator Conf.; pp. 3502-3503.

(Continued)

*Primary Examiner* — Louis Arana

(57) ABSTRACT

The present invention relates to a magnetic resonance examination system (10) and to a method of operating such a magnetic resonance examination system (10). In particular the present invention relates to a magnetic resonance examination system (10) comprising a superconducting main magnet (20) surrounding an examination region (18) and generating a main magnetic field in the examination region (18), and further comprising a magnetic field gradient system (30) selectively causing alternating gradient magnetic fields in the examination region (18), said magnetic field gradient system (30) being coupled to the main magnet (20). In order to provide a technique to reliably detect a quench of the superconducting main magnet (20) of such a magnetic resonance examination system (10) a detecting device (91) is suggested for detecting an emerging quench of the main magnet (20), said detecting device (91) being adapted to operate in different modes depending on the mode of operation of the magnetic resonance examination system (e.g. ramp-up, ramp-down or continuous operation).

11 Claims, 6 Drawing Sheets

FOREIGN PATENT DOCUMENTS

| | | | |
|---|---|---|---|
| JP | 07050208 | A | 2/1995 |
| JP | 08075810 | A | 3/1996 |
| JP | 09199315 | A | 7/1997 |
| WO | 2005124381 | A2 | 12/2005 |

OTHER PUBLICATIONS

Dixon, I. R., et al; Quench Detection and Protection of the Wide Bore 900 MHz NMR Magnet at the National High Magnetic Field Laboratory; 2004; IEEE Trans. on Applied Superconductivity; 14(2)1260-1263.

Kim, K.; A Fail-safe Quench Detection System for the Large-Scale Superconducting Magnets; 1994; IEEE Instrumentation and Measurement Technology Conf.; pp. 70-73.

Nogiec, J. M., et al.; Architecture of a Software Quench Management System; 2001; IEEE Proc. of 2001 Particle Accelerator Conf.; pp. 3460-3462.

Schultz, J. H.; Protection of Superconducting Magnets; 2002; IEEE Trans. on Applied Superconductivity; 12(1) 1390-1395.

Sharma, A. N., et al.; Quench detection and data acquisition system for SST-1 superconducting magnets; 2005; Fusion Engineering and Design; 74(1-4)819-823.

Takahata, K., et al.; Influence of magnetic hysteresis on quench-voltage detection in large superconducting magnets; 2006; Fusion Engineering and Design; 81:2571-2575.

* cited by examiner

DETECTING QUENCH IN A MAGNETIC RESONANCE EXAMINATION SYSTEM

FIELD OF THE INVENTION

The present invention relates to a magnetic resonance examination system and to a method of operating such a magnetic resonance examination system. In particular the present invention relates to a magnetic resonance examination system comprising a superconducting main magnet surrounding an examination region and generating a main magnetic field in the examination region, and further comprising a magnetic field gradient system selectively causing alternating gradient magnetic fields in the examination region, said magnetic field gradient system being coupled to the main magnet.

BACKGROUND OF THE INVENTION

Recently, new magnetic resonance examination system designs have been proposed, in which the main magnet system comprises magnet coils of superconductive material, and in which the magnetic field gradient system is located at the outside of the superconducting coil system and a weak-iron flux conduction system is provided to guide the magnetic gradient flux into the patient bore. A detailed description of such a magnetic resonance examination system is given in International Patent Application published as WO2005/124381 A2. A main advantage of such new magnetic resonance examination systems is a reduced scanner acoustic noise ("silent imaging"). Furthermore, the superconductive coils of the main magnet are closer to the examination region without compromising the effective bore size. Accordingly, less superconductive material is needed, which reduces the overall costs of the magnetic resonance examination system.

From conventional magnetic resonance examination systems, it is known to use a balanced bridge circuit to detect emerging quenches, i.e. loss of superconducting state in part of the coil. However, the arrangement of the magnetic field gradient system outside of the main magnet of the magnetic resonance examination system may induce voltages in the main magnet, which could misleadingly be interpreted as a quench. Prior art quench detecting methods are therefore not suitable to ensure a reliable detection of a quench of the superconducting main magnet of such a magnetic resonance examination system.

SUMMARY OF THE INVENTION

It is an object of the present invention to provide a technique to reliably detect a quench of the superconducting main magnet of a magnetic resonance examination system with a magnetic field gradient system being coupled to the main magnet in a way that the gradient magnetic field can induce voltages in the main magnet.

The object of the present invention is achieved by a magnetic resonance examination system, comprising a superconducting main magnet surrounding an examination region and generating a main magnetic field in the examination region, and further comprising a magnetic field gradient system selectively causing alternating gradient magnetic fields in the examination region, said magnetic field gradient system being coupled to the main magnet, wherein the magnetic resonance examination system comprises a detecting device for detecting an emerging quench of the main magnet, said detecting device being adapted to operate in different modes depending on the mode of operation of the magnetic resonance examination system.

This object is also achieved according to the invention by a method of operating a magnetic resonance examination system, said system comprising a superconducting main magnet surrounding an examination region and generating a main magnetic field in the examination region, and further comprising a magnetic field gradient system selectively causing alternating gradient magnetic fields in the examination region, said magnetic field gradient system being coupled to the main magnet, wherein the method comprises the step of detecting an emerging quench of the main magnet, said detecting being carried out in different modes depending on the mode of operation of the magnetic resonance examination system.

The object of the present invention is also achieved by a computer program to be executed in a computer, said program comprising computer instructions to detect an emerging quench of the main magnet of a magnetic resonance examination system with a magnetic field gradient system being coupled to the main magnet, said detection being carried out in different modes depending on the mode of operation of the magnetic resonance examination system, when the computer program is executed in the computer.

Technical effects necessary according to the invention can thus be realized on the basis of the instructions of the computer program in accordance with the invention. Such a computer program can be stored on a hard disk, on a carrier such as a CD-ROM or it can be available over the Internet or another computer network. Prior to executing the computer program is loaded into the computer by reading the computer program from the carrier, for example by means of a CD-ROM player, or from the internet, and storing it in the memory of the computer. The computer includes inter alia a central processor unit (CPU), a bus system, memory means, e.g. RAM or ROM etc., storage means, e.g. floppy disk or hard disk units etc. and input/output units. Alternatively, the inventive computer program could be implemented in hardware, e.g. using one or more integrated circuits.

A core idea of the invention is to provide a magnetic resonance examination system with a quench detection functionality, which operates in different modes depending on the mode of operation of the magnetic resonance examination system. In other words, the quench detection can be adapted to different behaviors of the magnetic resonance examination system or of parts of it during different modes of operation. As a result, a very flexible quench detection functionality is provided, which can be used, for example, if the main magnet of the magnetic resonance examination system shows a different behaviour during ramp-up or ramp-down on the one hand and during continuous operation on the other hand. Thus, with the present invention a reliable quench detection is achieved in case of the magnetic field gradient system being coupled to the main magnet. Because of the quench detection, the magnet will not be damaged as a result of a quench. Furthermore, because the quench detection technique can be realized using simple and robust components only, a very reliable quench detection can be ensured. As a result, a very safe and reliable magnetic resonance examination procedure can be provided. In general, the present application can be applied to all magnetic resonance examination systems, in which the gradient coil system can cause interfering voltages in the main magnet.

These and other aspects of the invention will be further elaborated on the basis of the following embodiments which are defined in the dependent claims.

The number of different modes, the detecting device is able to operate in, is not limited according to the present invention. For example, if there are two, three, or four modes of operation of the magnetic resonance examination system, the detecting device can be adapted to operate in two, three, or four different operating modes respectively.

According to a preferred embodiment of the invention the detecting device is adapted to operate in a first operating mode during ramp-up and ramp-down of the main magnet, in which mode the detecting device compares a first measurement signal ($U_{M,B}$) with a first threshold, and the detecting device is further adapted to operate in a second operating mode during continuous operation of the main magnet, in which mode the detecting device compares a second measurement signal ($U_{M,A}$) with a second threshold. The first threshold and the second threshold are defined preferably beforehand during setup of the magnetic resonance examination system. However, the thresholds can also be determined dynamically by the detecting device based on the known setup of the magnetic resonance examination system.

According to a preferred embodiment of the invention said first measurement signal is a bridge voltage over the resistance of an electrical bridge circuit coupled to the coil(s) of the main magnet. In this case the electrical bridge preferably divides the coil(s) of the main magnet into two symmetric coil sections. In other words, there is a balanced bridge voltage in case of no quenches, i.e. the bridge voltage is zero, if the bridge is in a balanced condition. In case of a quench in the main magnet, the bridge voltage becomes non-zero.

According to a preferred embodiment of the invention said second measurement signal is the total voltage over the main magnet. In order to ensure, that the total voltage can be used as second measurement signal during continuous operation of the main magnet, the main magnet is preferably adapted in a way that the magnetic field gradient system do not cause substantial induced voltages in the main magnet during continuous operation of the main magnet. In other words, it has to be assured, that the total voltage over the main magnet is not corrupted by changing gradient magnetic fields, which are inherent to the magnetic examination system with gradient coils coupled to the main magnet. However, the gradient coils have a symmetry relative to the midplane of the magnet, hence no net-coupling occurs.

According to a preferred embodiment of the invention the detecting device comprises a switching means for automatically switching the detecting device between the first operating mode and the second operating mode, said switching means being adapted to receive signals indicating the mode of operation of the magnetic resonance examination system. Preferably a transistor or a relay is used as a switching means. Thereby the switching means receives signals from the power supply control, which specifies the mode of operation (ramp-up, ramp-down, or continuous operation). According to the mode of operation of the magnetic resonance examination system, the switching means selects the mode of operation of the detecting device. Alternatively, the switching means can be implemented as a digital switch in a computer system. According to such an implementation, the control signal of the power supply, which specifies the mode of operation of the magnetic resonance examination system, is passed to the computer system and a software program is used to set the corresponding mode of operation of the detecting device.

According to a preferred embodiment of the invention the detecting device is adapted to control a protecting means to protect the main magnet in case of a quench. In particular the detecting means is adapted to disconnect the power supply of the main magnet if an emerging quench is detected. Preferably the detecting device is adapted to operate a switch to disconnect the power supply of the main magnet in such a case. The magnetic resonance examination system is preferably arranged in a way, that the main magnet is ramped-down safely by dissipating the stored electromagnetic energy outside the main magnet's windings. This means limits an uncontrolled dissipation of the electromagnetic energy in the main magnet's windings, which can damage or destroy the main magnet. Instead, most of the magnetic energy is safely dissipated in special resistors.

Preferably, the magnetic resonance examination system comprises a number of large electrical resistors connected to the main magnet in a way that the electric current through the superconducting coil of the main magnet is directed through these resistors in case the power supply of the main magnet is disconnected. In this case said resistors act as a kind of "energy absorber" by receiving the current from the superconducting coil and transforming said current into heat. In other words, the electrical resistors dissipate significant amounts of energy outside the main magnet's windings and, thus, local heating in the region where the quench started is minimized. Thus, in case of a false trigger of the detecting device, i.e. an unnecessary disconnecting of the power supply of the main magnet, the main magnet remains in the superconducting state, and can be put into operation again without any unnecessary delay.

BRIEF DESCRIPTION OF THE DRAWINGS

These and other aspects of the invention will be described in detail hereinafter, by way of examples, with reference to the following embodiments and the accompanying drawings; in which.

DETAILED DESCRIPTION OF THE EMBODIMENTS

Figure 1:
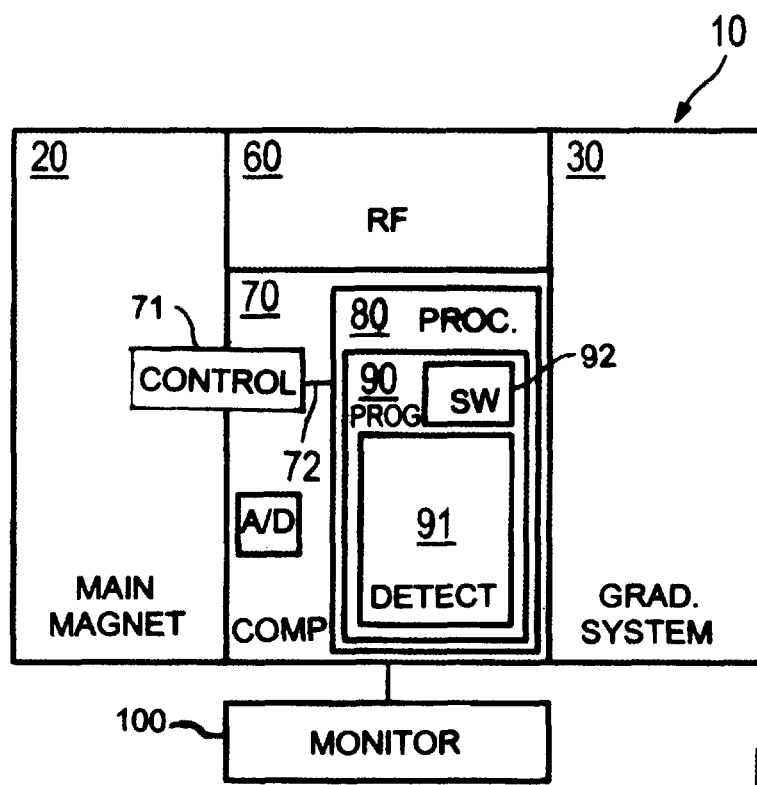
FIG. 1 shows a schematic block diagram of a magnetic resonance imaging system.

As illustrated in FIG. 1, the magnetic resonance imaging (MRI) scanner 10 comprises a superconducting main magnet 20, which surrounds an examination region 18 (see FIG. 2) and generates a main magnetic field in the examination region 18. Furthermore the MRI scanner 10 comprises a magnetic field gradient system 30 that enables spatial localization of the MRI signals. The magnetic field gradient system 30 selectively causes alternating gradient magnetic fields in the examination region 18, and is disposed outside of the main magnet 20, as described below in more detail. Furthermore the MRI scanner 10 comprises a radio frequency (RF) system 60 that transmits energy and receives signal information, and a computer system 70 to control the scanner's components and subsystems.

Figure 2:
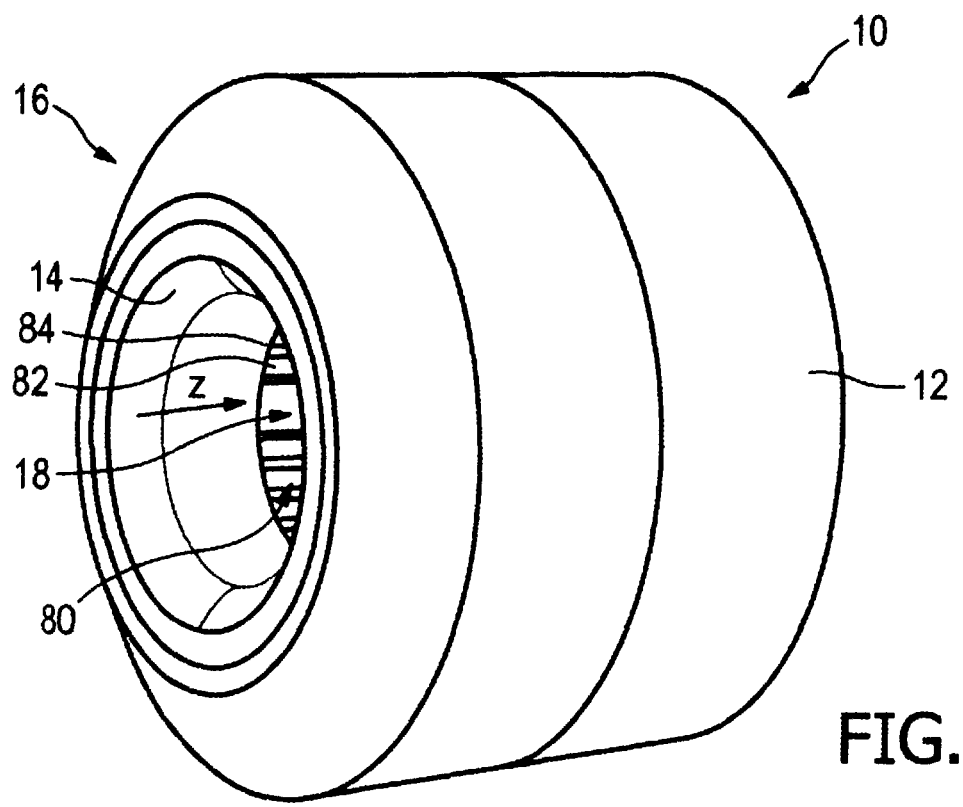
FIG. 2 shows a perspective view of the magnetic field generating parts of a magnetic resonance imaging system.
Figure 3:
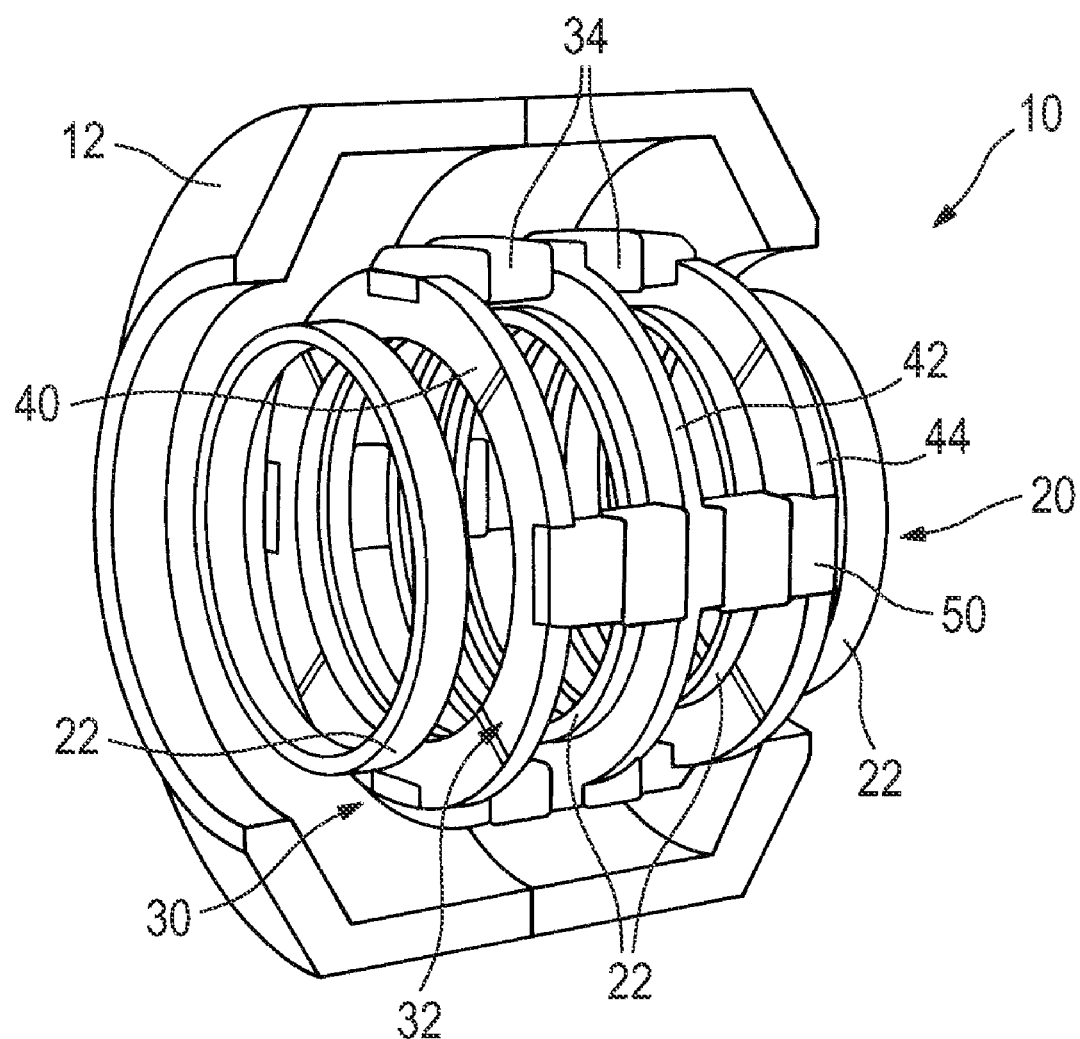
FIG. 3 shows a perspective view of a magnetic resonance imaging system of FIG. 2, in which a portion of the vacuum jacket and the support tube of the main field magnet have been removed to reveal the main magnet coils and the magnetic field gradient system.

With reference to FIGS. 2 and 3, the MRI scanner 10 includes a housing made up of an outer flux return shield 12 and an inner bore tube 14. The outer flux return shield 12 and the inner bore tube 14 are sealed together to define a vacuum jacket 16. An examination region 18 lies inside of the bore tube 14. The patient or other imaging subject is positioned in the examination region 18. A main magnet 20 is disposed inside of the vacuum jacket 16. The magnet 20 is made using superconducting material, e.g. a high Tc superconductor operating at 30 to 100 K. The main magnet 20 includes a plurality of spaced apart generally annular magnet windings segments 22, six segments in the embodiment of FIG. 3. Each windings segment 22 includes a number of turns of an electrical conductor, preferably a superconductor. Typically, the main magnet 20 is closer to the bore tube 14 than to the flux return shield 12.

The windings segments 22 of the main magnet 20 are designed to produce a substantially spatially uniform magnetic field in the examination region 18 in which the main magnetic field vector is directed along an axial or z-direction parallel to the axis of the bore tube 14. The outer flux return shield 12 is made of a ferromagnetic material and provides a flux return path for completing the magnetic flux loop. That is, magnetic flux generated by the main magnet 20 follows a closed loop that passes through the inside of the bore tube 14 including the examination region 18 and closes back on itself by passing through the flux return shield 12. As a result, there exists a low magnetic field region within the vacuum jacket 16 between the magnet 20 and the flux return shield 12.

A magnetic field gradient system 30 is disposed in the low magnetic field region existing outside the main magnet 20 and inside the flux return shield 12. The magnetic field gradient system 30 incorporates coils and optionally ferromagnetic parts arranged such as to generate gradient fields Gx, Gy, Gz for imaging. These coils and parts are positioned and shaped in a way that on switching the gradients the net voltage induced in the whole magnet circuit is zero. This particular arrangement is described in the U.S. Provisional Patent Application U.S. 60/752,121, filed on Dec. 20, 2005, which as a whole is hereby incorporated by reference. As it can be seen in FIGS. 2 and 3 a ferromagnetic yoke 32 is employed, which includes three ferromagnetic rings 40, 42, 44 disposed between the generally annular magnet windings segments 22. The magnetic field gradient system 30 further includes a plurality of magnetic field gradient coils 34. These field gradient coils 34 include wire turns or other electrical conductors wrapped around ferromagnetic crossbars 50 which are arranged generally transverse to the ferromagnetic rings 40, 42, 44 and which are connected with the ferromagnetic rings 40, 42, 44. The magnetic field gradient system 30 has a four-fold rotational symmetry provided by arrangement of four crossbars 50 at ninety degree annular intervals. Each crossbar 50 includes magnetic field gradient coils 34 wrapped on either side of the plane of bilateral symmetry.

More detailed information about the arrangement of the magnetic field gradient system 30 if the MRI scanner 10 is given in International Patent Application published as WO2005/124381 A2, which as a whole is hereby incorporated by reference.

The computer system 70 of the MRI scanner 10 comprises a processing unit 80, which is adapted according to the invention for performing all tasks of calculating and computing data as well as determining and assessing results. This is achieved according to the invention by means of a computer program 90 comprising computer instructions adapted for carrying out the steps of the inventive method, when the software is executed in the processing unit 80. In particular, the processing unit 80 is adapted to execute a computer program 90 for detecting an emerging quench of the main magnet 20, said detecting being carried out in different modes depending on the mode of operation of the MRI scanner 10. By execution of the computer program 90 a software detecting module 91 is implemented, the functionality of which is discussed in more detail below. All devices, in particular the processing unit 80, and the implemented software detecting module 91, are constructed and programmed in a way that the procedures for data processing run in accordance with the method of the invention. The processing unit 80 itself may comprise functional modules or units, which are implemented in form of hardware, software or in form of a combination of both. In other words, the present invention could also be implemented merely using dedicated hardware, without using a computer program. In this case the software detecting module 91 would be implemented as a hardware device showing identical functionality. The computer system 70 of the MRI scanner 10 is connected to an external touch screen monitor 100, which serves as interface to the MRI scanner's operator. Alternatively a conventional monitor screen is used in combination with a computer keyboard and/or computer mouse.

Figure 4:
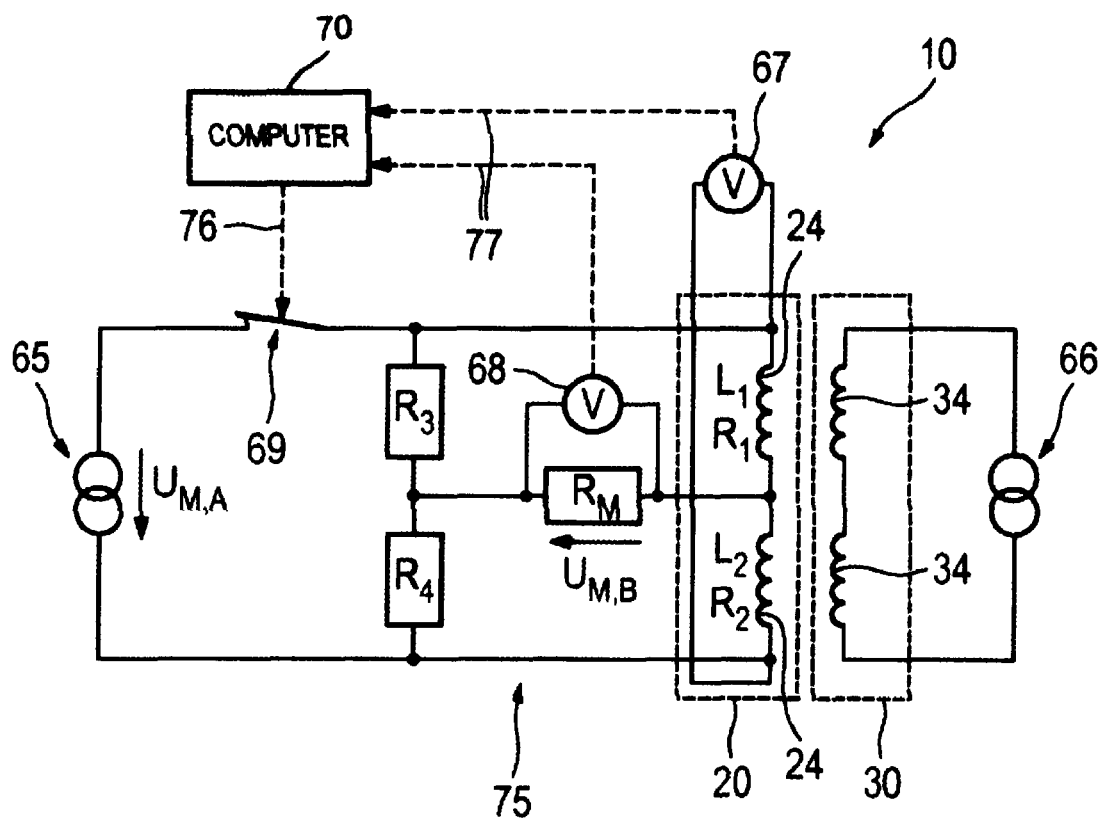
FIG. 4 shows a schematic electrical circuit illustrating components of the magnetic resonance imaging system.

With reference to FIG. 4, the MRI scanner 10 comprises a first power supply 65 for the superconducting coils of the main magnet 20 and a second power supply 66 for the coils of the magnetic field gradient system 30. By means of a suitable measurement device 67, e.g. a high-impedance voltmeter, the total voltage $U_{M,A}$ of the main magnet 20 is measured near the coils of the main magnet 20. The connection of the power supply 65 for the superconducting coils of the main magnet 20 can be disconnected by means of a switch 69. The coils of the main magnet 20 are given as a symmetric circuit with inductances $L_1$, $L_2$ and resistances $R_1$, $R_2$. An electrical bridge 75 is connected to the superconducting coils of the main magnet 20, dividing the coils of the main magnet 20 into two symmetric coil sections 24, forming a balanced bridge circuit. A large measuring resistor $R_M$ is provided to pick-off a bridge voltage $U_{M,B}$ by means of a suitable measurement device 68, e.g. a high-impedance voltmeter. Preferably, the value of the resistor $R_M$ is in the order of one to several kilo-Ohms. The measuring devices 67, 68 are connected to the analogue digital converter 73 of the computer system 70 by means of signal lines 77. The bridge circuit 75 further comprises two large electrical resistors $R_3$, $R_4$. The dimensions of the resistors $R_3$ and $R_4$ depends on the inductivity L of the main magnet 20 and are preferably chosen in a way which ensures, that the current in the main magnet 20 decreases fast, e.g. in the order of 1 s. Given this time constant, $R_3$ and $R_4$ must meet the condition $L/(R_3+R_4) \approx 1$ s. Resistors $R_3$ and $R_4$ are connected in parallel to the coil sections 24 of the main magnet 20. During ramp-up and continuous operation the switch 69 is closed. In this case, all current is carried by the coils of the main magnet 20, because the resistances $R_3$, $R_4$ and $R_M$ are much larger than the resistances $R_1$, $R_2$ of the main magnet 20.

Figure 5:
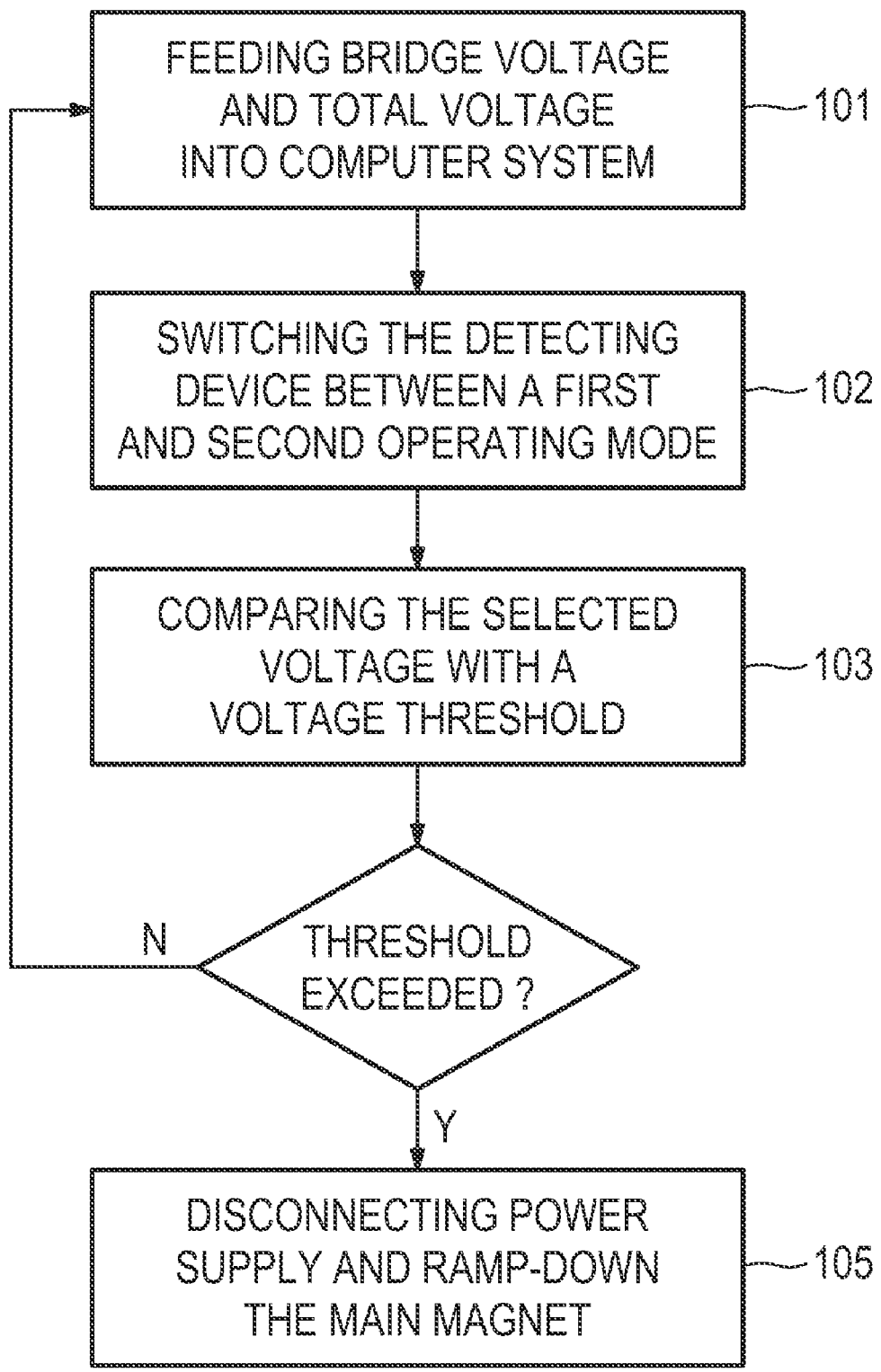
FIG. 5 shows a flow chart of the method according to the invention.

With additional reference to FIG. 5, now the method of operating of the MRI scanner 10 is described. In a feeding step 101 both the bridge voltage $U_{M,B}$ the and total voltage $U_{M,A}$ of the main magnet 20 are fed into the computer system 70, where these measurement signals are converted into digital signals by means of an analogue-digital converter 73.

Since the computer system 70 controls the power supply 66 of the main magnet 20, it permanently controls the operating mode of the MRI scanner 10. In other words, a control circuit 71 of the computer system 70 may generate operating signals, said operating signals indicating, if the MRI scanner 10 operates in a continuous operation mode or in a ramp-up or ramp-down mode. The software detecting module 91 receives these signals from the control circuit 71 via a signal line 72. Within the computer program 90 a switching software switching module 92 is implemented for receiving said signals. The software switching module 92 could as well be implemented as part of the software detecting module 91. Depending on these signals, the software switching module 92 automatically switches the software detecting module 91 between a first operating mode and a second operating mode in a switching step 102. Now, if the software detecting module 91 is in it's first operating mode, the bridge voltage $U_{M,B}$ is used in order to detect a quench of the main magnet 20, and if the software detecting module 91 is in it's second operating mode, the total voltage $U_{M,A}$ is used in order to detect a quench of the main magnet 20.

For detecting an quench, the bridge voltage $U_{M,B}$ or the total voltage $U_{M,A}$ is compared by means of the software detecting module 91 with a first or second threshold voltage $U_{q,B}$ or $U_{q,A}$, respectively, in a comparing step 103, said threshold voltages $U_{q,B}$, and $U_{q,A}$ being stored in a database of the computer system 70. The bridge voltage $U_{M,B}$, which is used during ramp-up and ramp-down, is compared to the threshold voltage $U_{q,B}$, and the total voltage $U_{M,A}$ is compared to the threshold value $U_{q,A}$, respectively.

The software detecting module 91 controls the switch 69 via a control line 76, which connects the computer system 70 and the switch. If a threshold is exceeded the switch is opened in step 105 by means of the software detecting module 91 and the power supply of the main magnet 20 is disconnected. The main magnet 20 is then ramped-down safely by dissipating all stored electromagnetic energy outside the main magnet's windings, namely in the electrical resistors $R_3$, $R_4$. Optionally additional heating elements (not shown), e.g. in form of resistors, are used for purposeful heating the superconducting coil of the main magnet 20, if a quench has been detected. Such heating elements are preferably controlled by the computer system 70. Due to a homogeneous heating, the electrical resistance of the main magnet 20 can be increased. As a result, the creation of so called hot-spots on the main magnet 20 can be prevented. Hot-spots correspond to locally confined resistive conducting areas. In these areas, the temperature increases due to dissipation which causes additional increase of resistivity and thus additional temperature rise. In particular if the main magnet is made of high Tc superconductive material, in which heat conduction is very slow, heat generation due to dissipation exceeds heat conduction and thus can lead to severe damages in the main magnet 20.

Figure 6:
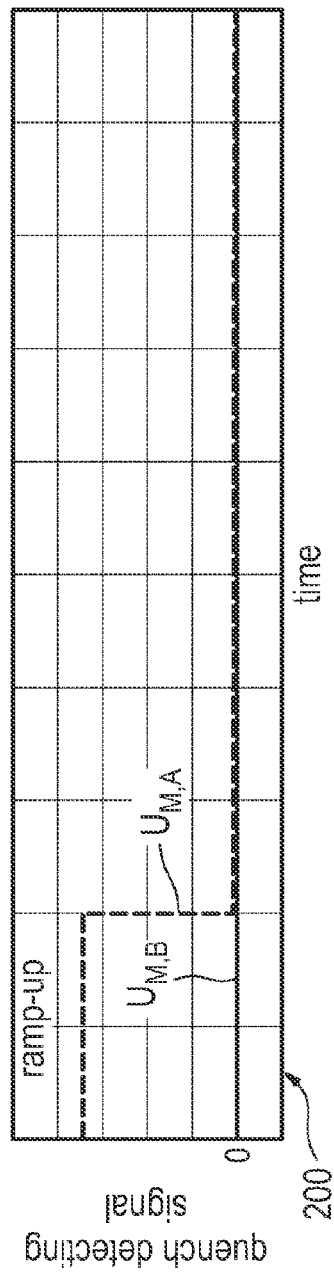
FIG. 6 shows a diagram of measurement signals during ramp-up of the main magnet.
Figure 7:
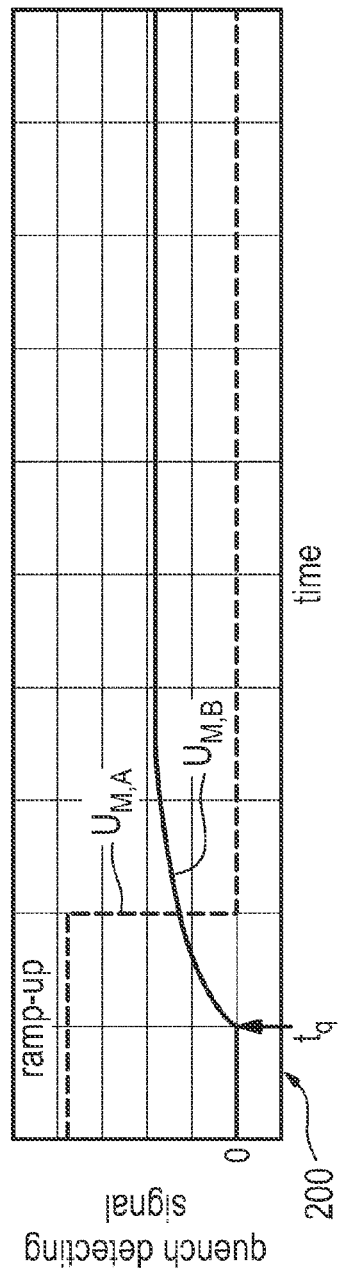
FIG. 7 shows a diagram of measurement signals during ramp-up, with a starting quench.
Figure 8:
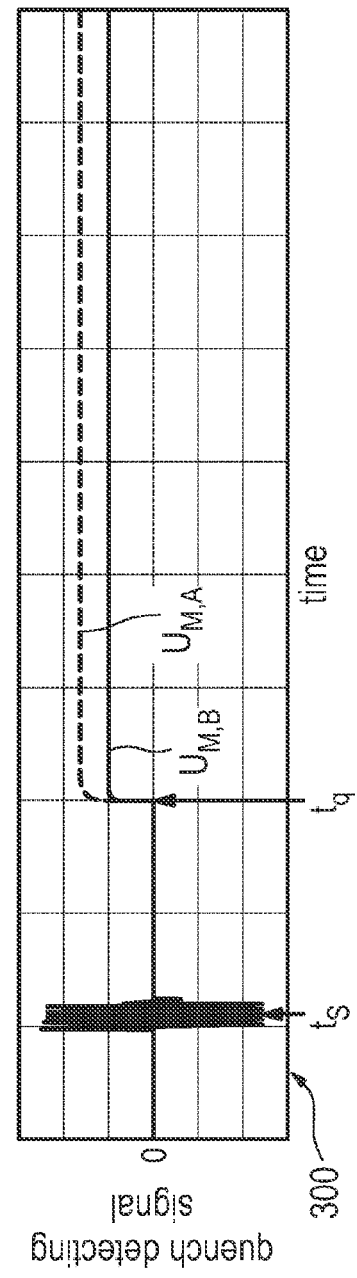
FIG. 8 shows a diagram of measurement signals during continuous operation of the main magnet, with a starting quench.

With reference to FIGS. 6 to 8, the measurement signals $U_{M,A}$ (solid line) and $U_{M,B}$ (dotted line) will be discussed. FIG. 6 illustrates the developing of both signals during ramp-up of the main magnet 20. In the ramp-up phase 200 the total voltage $U_{M,A}$ is large due to the inductance of the main magnet's coils. Because $U_{M,A}$ is so large, it cannot be used during this phase for indicating a quench of the main magnet 20. However, the bridge voltage $U_{M,B}$ remains zero and unaffected by the ramp-up of the main magnet 20. Hence, during the ramp-up phase 200, the bridge voltage $U_{M,B}$ is employed by the software detecting module 91 as measuring signal to detect an emerging quench. The software detecting module 91 indicates the quench, if the bridge voltage $U_{M,B}$ exceed the threshold $U_{q,B}$.

The emerging of a quench is illustrated in FIG. 7. At a certain point in time $t_q$ during the ramp-up phase 200 a quench of the main magnet 20 occurs. In other words, a part of the main magnet changes state from superconductivity to normal resistivity. The course of the total voltage $U_{M,A}$ remains almost unchanged, since it is largely dominated by the inductance. However, the bridge voltage $U_{M,B}$ shows a significant change, because the bridge 75 is unbalanced due to a resistivity change either in the upper or in the lower section 24 of the main magnet's coils. Furthermore, in case of a ramp-down of the main magnet 20, the same signal behaviour can be obtained. Thus, the bridge voltage $U_{M,B}$ is employed by the software detecting module 91 as measuring signal to detect an emerging quench also during the ramp-down phase (not shown).

FIG. 8 shows both $U_{M,A}$ and $U_{M,B}$ during continuous operation phase 300 of the main magnet 20. As it can be seen on the left hand side of the diagram, the bridge voltage $U_{M,B}$ is heavily influenced by alternating gradient magnetic fields caused by switching the magnetic field gradient system 30 at a switching time $t_S$, since the magnetic field gradient system 30 induces voltages in the main magnet 20. $U_{M,A}$ on the other hand remains constant and unaffected by such alternating gradient magnetic fields, because of the symmetry of the gradient system 30 and main magnet 20 arrangement. In case of an emerging quench at a certain point in time $t_q$ during continuous operation of the main magnet 20, both $U_{M,A}$ and $U_{M,B}$ changes. While a change of $U_{M,B}$ may be caused by gradient switching, a change of $U_{M,A}$ reliably indicates a quench. Hence, during the phase of continuous operation, the total voltage $U_{M,A}$ is employed by the software detecting module 91 as measuring signal to detect an emerging quench. The software detecting module 91 indicates the quench, if the total voltage $U_{M,A}$ exceed the threshold $U_{q,A}$.

With the present invention, quenches can reliably be detected during ramp-up, ramp-down, and continuous operation in the main magnet 20. Furthermore, the quench detection is unaffected by the switching of the magnetic field gradient system 30.

Figure 9:
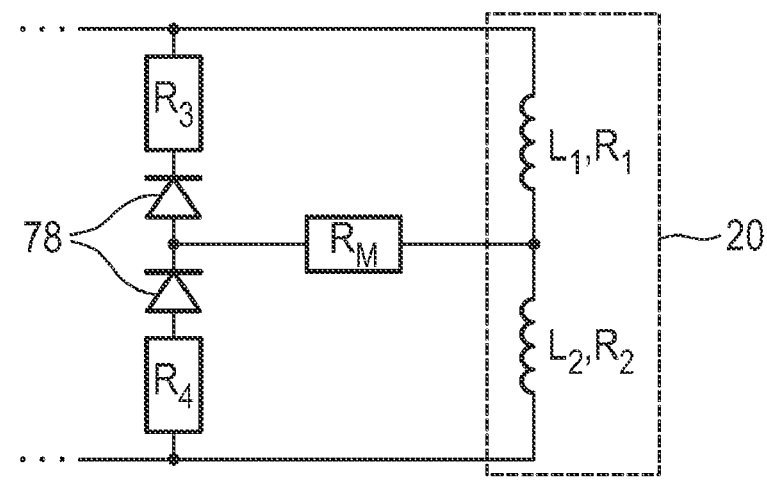
FIG. 9 shows a schematic electrical circuit illustrating another embodiment of the present invention.
Figure 10:
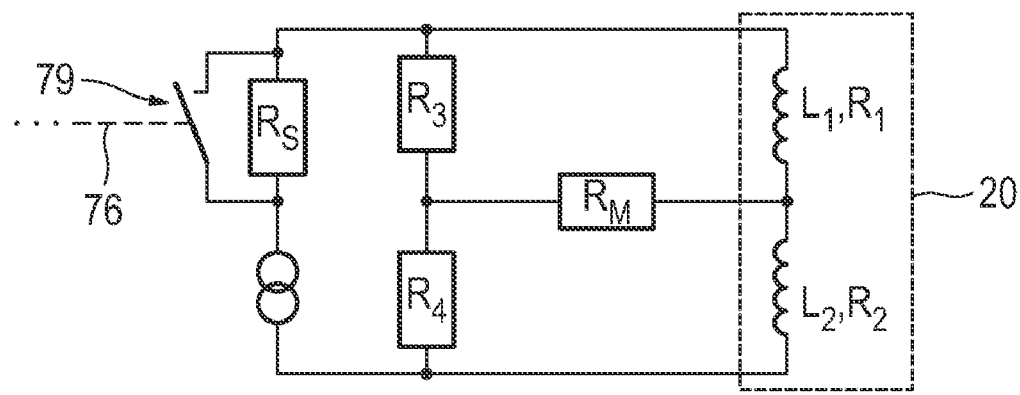
FIG. 10 shows a schematic electrical circuit illustrating yet another embodiment of the present invention.
Figure 11:
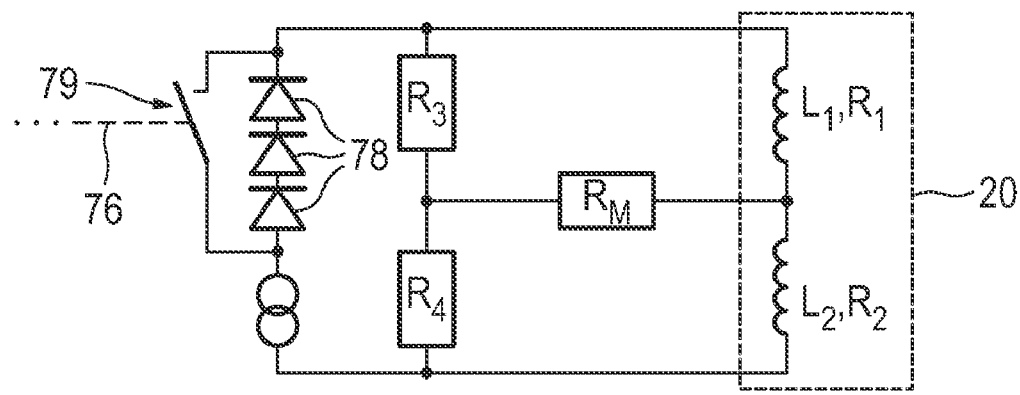
FIG. 11 shows a schematic electrical circuit illustrating yet another embodiment of the present invention.

FIGS. 9, 10, and 11 illustrate further embodiments of the present invention. In FIG. 9 diodes 78 are connected in series with the resistors $R_3$ and $R_4$ in order to avoid a residual current through the electrical resistors $R_3$ and $R_4$. A switch 69 is employed in the same way as illustrated in FIG. 4. In FIG. 10 a resistor $R_S$ (1 Ohm), and the further resistors $R_3$, $R_4$, and $R_M$ (each having 1 kilo-Ohm), are used. Furthermore a switch 79 is employed, as shown. During operation, the switch 79 is closed and no current passes $R_S$. In case of a detected quench, the power supply is turned off and the switch 79 is opened. As a result all current passes $R_S$ and is partly dissipated there. Switch 79 is controlled by the computer 70 in the same way as described above. In FIG. 11 a number of diodes 78 are used instead of resistor $R_S$ (see FIG. 10). The advantage of a cascade of diodes 78 compared to a resistor is the non-linear characteristic current/voltage curve. Therefore, the voltage drop over the diodes 78 (and with this dissipation in the diodes) remains larger for decreasing currents than in the case of using a resistor.

It will be evident to those skilled in the art that the invention is not limited to the details of the foregoing illustrative embodiments, and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. It will furthermore be evident that the word "comprising" does not exclude other elements or steps, that the words "a" or "an" do not exclude a plurality, and that a single element, such as a computer system or another unit may fulfill the functions of several means recited in the claims. Any reference signs in the claims shall not be construed as limiting the claim concerned.

REFERENCE NUMERALS

10 MRI scanner
12 flux return shield
14 bore tube
16 vacuum jacket
18 examination region
20 main magnet
21 temperature sensor
22 winding segment
24 coil section
30 gradient system
32 yoke
34 gradient coil
40 ring
42 ring
44 ring
50 crossbar
60 RF system
65 main magnet's power supply
66 gradient system's power supply
67 measurement device
68 measurement device
69 switch
70 computer system
71 control circuit
72 signal line
73 analogue digital converter
75 electrical bridge
76 control line
77 signal line
78 diode
79 switch
80 processing unit
90 computer program
91 software detecting module
92 software switching module
100 monitor
101-105 method steps
200 ramp-up phase
300 continuous operation phase

The invention claimed is:

1. A magnetic resonance examination system, comprising
a superconducting main magnet surrounding an examination region and generating a main magnetic field in the examination region, and
a magnetic field gradient system selectively causing alternating gradient magnetic fields in the examination region, said magnetic field gradient system being coupled to the main magnet,
wherein the magnetic resonance examination system comprises a detecting device for detecting an emerging quench of the main magnet, said detecting device being adapted to operate in different modes depending on the mode of operation of the magnetic resonance examination system,
wherein
the detecting device is adapted to operate in a first operating mode during ramp-up and ramp-down of the main magnet, in which mode the detecting device compares a first measurement signal with a first threshold, and
the detecting device is adapted to operate in a second operating mode during continuous operation of the main magnet, in which mode the detecting device compares a second measurement signal with a second threshold.

2. The system as claimed in claim 1, wherein the first measurement signal is a bridge voltage over the resistance of an electrical bridge circuit coupled to the coils of the main magnet.

3. The system as claimed in claim 2, wherein the electrical bridge divides the coils of the main magnet into two symmetric coil sections.

4. The system as claimed in claim 1, wherein the second measurement signal is the total voltage over the main magnet.

5. The system as claimed in claim 4, wherein the main magnet is adapted in a way that the magnetic field gradient system do not cause substantial induced voltages in the main magnet during continuous operation of the main magnet.

6. The system as claimed in claim 1, wherein the detecting device comprises a switching means for switching the detecting device between the first operating mode and the second operating mode, said switching means being adapted to receive signals indicating the mode of operation of the magnetic resonance examination system.

7. The system as claimed in claim 1, wherein the detecting device is adapted to control a protecting means to protect the main magnet in case of a quench.

8. A method of operating a magnetic resonance examination system, said system comprising a superconducting main magnet surrounding an examination region and generating a main magnetic field in the examination region, and further comprising a magnetic field gradient system selectively causing alternating gradient magnetic fields in the examination region, said magnetic field gradient system being coupled to the main magnet, wherein the method comprises the step of detecting an emerging quench of the main magnet, said detecting being carried out in different modes depending on the mode of operation of the magnetic resonance examination system,
wherein
in a first operating mode during ramp-up and ramp-down of the main magnet, the detection is performed by comparing a first measurement signal with a first threshold, and
in a second operating mode during continuous operation of the main magnet, the detection is performed by comparing a second measurement signal with a second threshold.

9. The method as claimed in claim 8, wherein the main magnet is divided into symmetrical sections by an electrical bridge and the first measurement signal is based on a measured voltage over the bridge and the second measurement signal is based on a measured voltage over the main magnet.

10. A non-transitory computer-readable medium carrying software for controlling to detect an emerging quench of the main magnet of a magnetic resonance examination system by performing the steps of:

in a first operating mode during ramp-up and ramp-down of the main magnet, receiving a first measurement signal and comparing the first measurement signal with a first threshold, and in a second operating mode during continuous operation of the main magnet, receiving a second measurement signal and comparing the second measurement signal with a second threshold.

11. The non-transitory computer readable medium as claimed in claim 10, wherein the main magnet is divided into symmetrical sections by an electrical bridge and the first measurement signal is based on a measured voltage over the bridge and the second measurement signal is based on a measured voltage over the main magnet.

* * * * *